(12) United States Patent
Park et al.

(10) Patent No.: US 10,734,390 B1
(45) Date of Patent: Aug. 4, 2020

(54) METHOD OF MANUFACTURING MEMORY DEVICE

(71) Applicant: Winbond Electronics Corp., Taichung (TW)

(72) Inventors: Cheol Soo Park, Taichung (TW); Ming-Tang Chen, Taichung (TW); Shuen-Hsiang Ke, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/354,177

(22) Filed: Mar. 15, 2019

(51) Int. Cl.
| | |
|---|---|
| *H01L 27/108* | (2006.01) |
| *H01L 21/311* | (2006.01) |
| *H01L 21/768* | (2006.01) |
| *H01L 21/762* | (2006.01) |

(52) U.S. Cl.
CPC .. *H01L 27/10885* (2013.01); *H01L 21/31144* (2013.01); *H01L 21/76224* (2013.01); *H01L 21/76802* (2013.01); *H01L 21/76877* (2013.01); *H01L 27/10891* (2013.01)

(58) Field of Classification Search
None
See application file for complete search history.

(56) References Cited

U.S. PATENT DOCUMENTS

| | | | |
|---|---|---|---|
| 9,613,967 B1 | 4/2017 | Chien et al. | |
| 10,332,572 B2 * | 6/2019 | Chang | G11O 5/02 |
| 2019/0019795 A1 | 1/2019 | Takesako et al. | |

FOREIGN PATENT DOCUMENTS

TW    I597822    9/2017

* cited by examiner

*Primary Examiner* — Robert K Carpenter
(74) *Attorney, Agent, or Firm* — JCIPRNET

(57) ABSTRACT

A method of manufacturing a memory device includes following steps. A first dielectric layer is formed on the substrate between bit-line structures. First trenches are formed in the first dielectric layer. A second dielectric layer is formed to fill in the first trenches. A portion of the first dielectric layer is removed, so that a top surface of the first dielectric layer is lower than a top surface of the second dielectric layer. A first mask layer is formed to cover the top surfaces of the first and second dielectric layers. A first etching process is performed to form second trenches in the first dielectric layer. A third dielectric layer is formed to fill the second trenches. The first dielectric layer is removed to form contact openings between the second and third dielectric layers. A conductive material is formed to fill in the contact openings.

16 Claims, 13 Drawing Sheets

A-A'

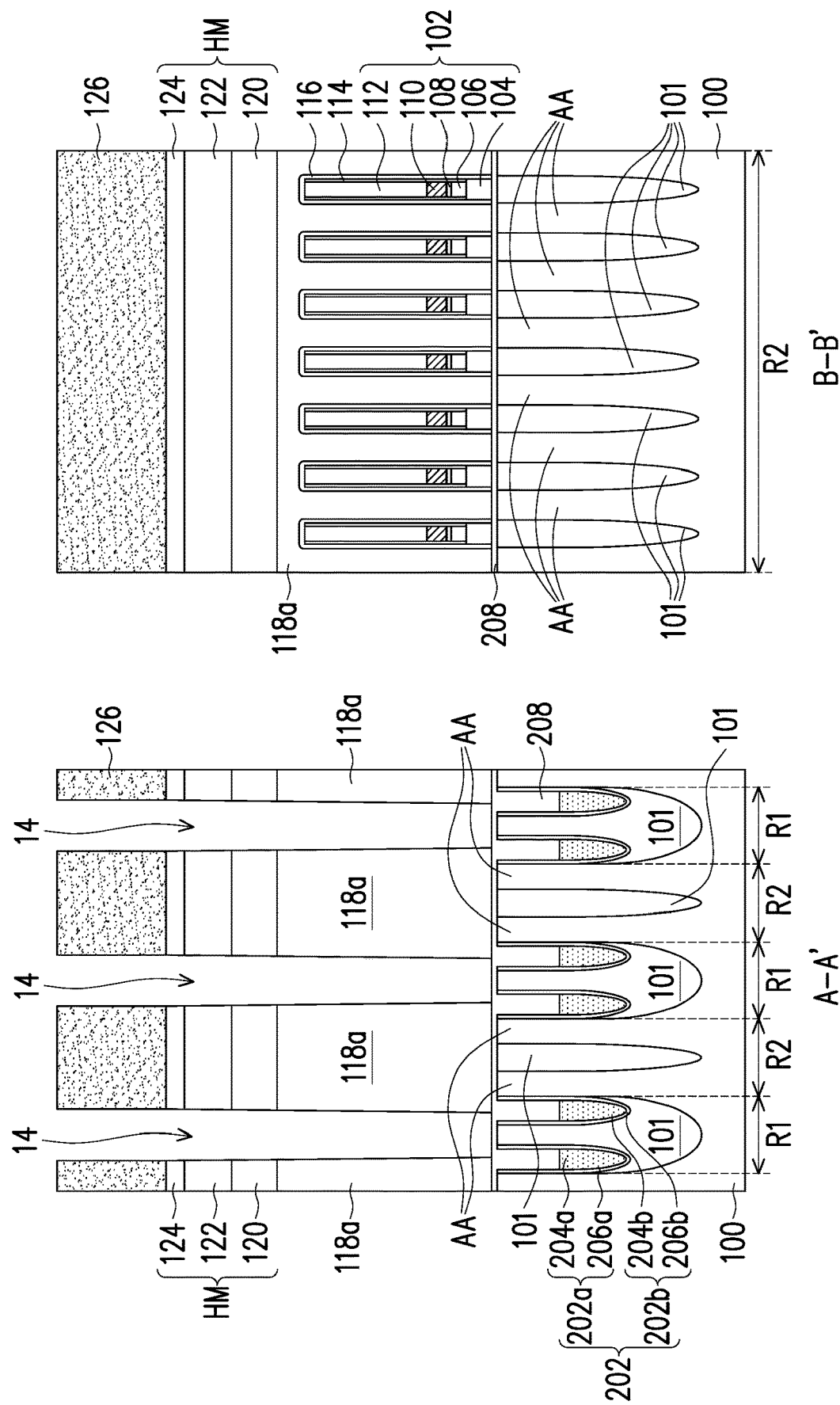

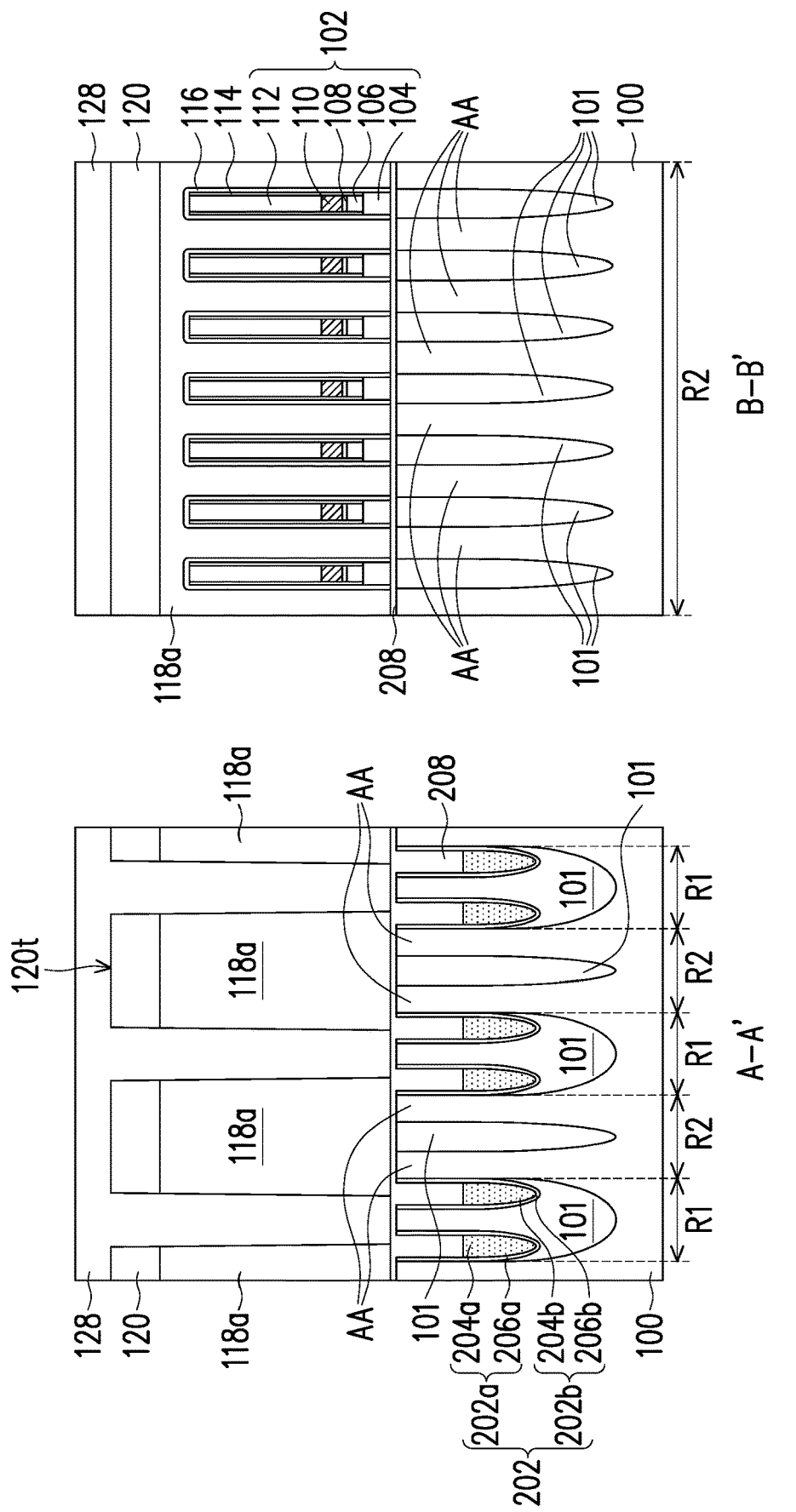

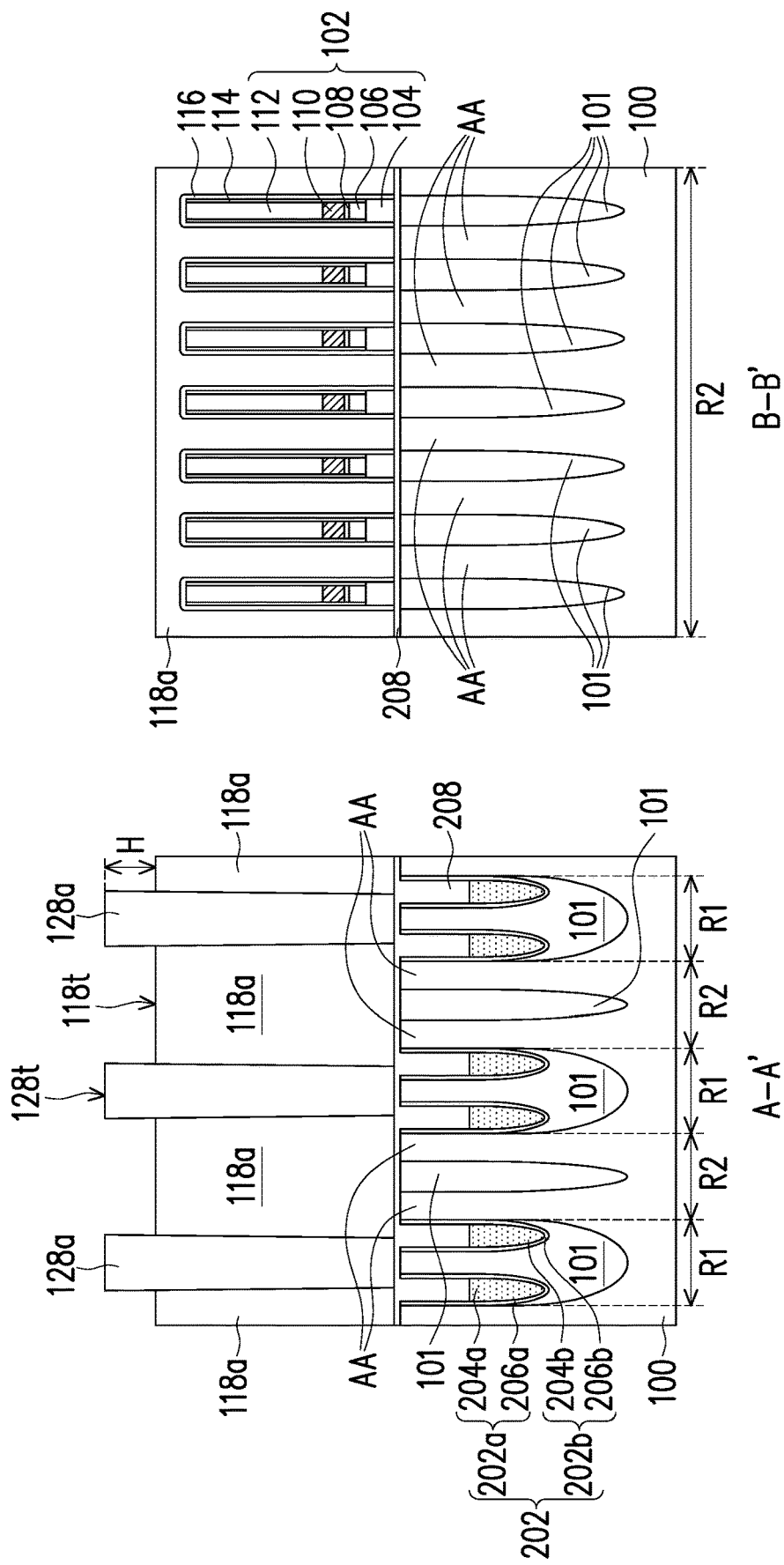

METHOD OF MANUFACTURING MEMORY DEVICE

BACKGROUND

Field of the Invention

The invention relates to a method of manufacturing a semiconductor device and more particularly, to methods of manufacturing a memory device.

Description of Related Art

A dynamic random access memory (DRAM) is a volatile memory formed by a plurality of memory cells. Each of the memory cells is mainly composed of a transistor and a capacitor controlled by the transistor, and the memory cells are electrically connected with one another through word lines and bit lines. In order to improve the integration of DRAM to increase the operating speed of the device and to meet the consumers' demand for miniaturization of electronic devices, buried word line DRAM has been developed in recent years for the aforementioned purposes.

With development of technology, electronic products are developed to have design features of lightness, slimness, shortness and smallness. In this case, the critical dimension of the DRAM is also reduced, which result in many challenges for the DRAM process.

SUMMARY

The invention provides a method of manufacturing a memory device capable of controlling a critical dimension (CD) of a capacity contact accurately, thereby enhancing a reliability of the memory device.

A method of manufacturing a memory device is provided. The method includes the following steps. A plurality of isolation structures are formed in a substrate to divide the substrate into a plurality of active areas. A plurality of word line sets are formed in the substrate, wherein the word line sets extend in a Y direction and pass through the isolation structures and the active areas. A plurality of bit-line structures are formed on the substrate, wherein the bit-line structures extend in the X direction and cross the word line sets. A first dielectric layer is formed on the substrate between the bit-line structures. A plurality of first trenches are formed in the first dielectric layer, wherein the first trenches respectively correspond the word line sets. A second dielectric layer is formed to fill in the first trenches. A portion of the first dielectric layer is removed, so that a top surface of the first dielectric layer is lower than a top surface of the second dielectric layer. A first mask layer is formed to cover the top surface of the first dielectric layer and the top surface of the second dielectric layer. A first etching process is performed by using the first mask layer as a mask to form a plurality of second trenches in the first dielectric layer. A third dielectric layer is formed to fill the second trenches. The first dielectric layer is removed to form a plurality of contact openings between the second and third dielectric layers. A conductive material is formed to fill in the contact openings.

Based on the above, in the invention, the first dielectric layer is first formed, the second and third dielectric layers are then formed in the first dielectric layer. Thereafter, the first dielectric layer is removed to form a plurality of contact openings. The conductive material is then formed to fill in the contact openings, so as to form a plurality of capacitor contacts. That is, in the invention, the capacitor contacts are formed by a damascene method, which is able to simplify the method of manufacturing the capacitor contacts and control the critical dimension of the capacitor contacts accurately.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2L are schematic cross-sectional views of a manufacturing process of the memory device along line A-A' depicted in FIG. 1.

FIG. 3A to FIG. 3L are schematic cross-sectional views of a manufacturing process of the memory device along line B-B' depicted in FIG. 1.

DESCRIPTION OF EMBODIMENTS

Figure 1:
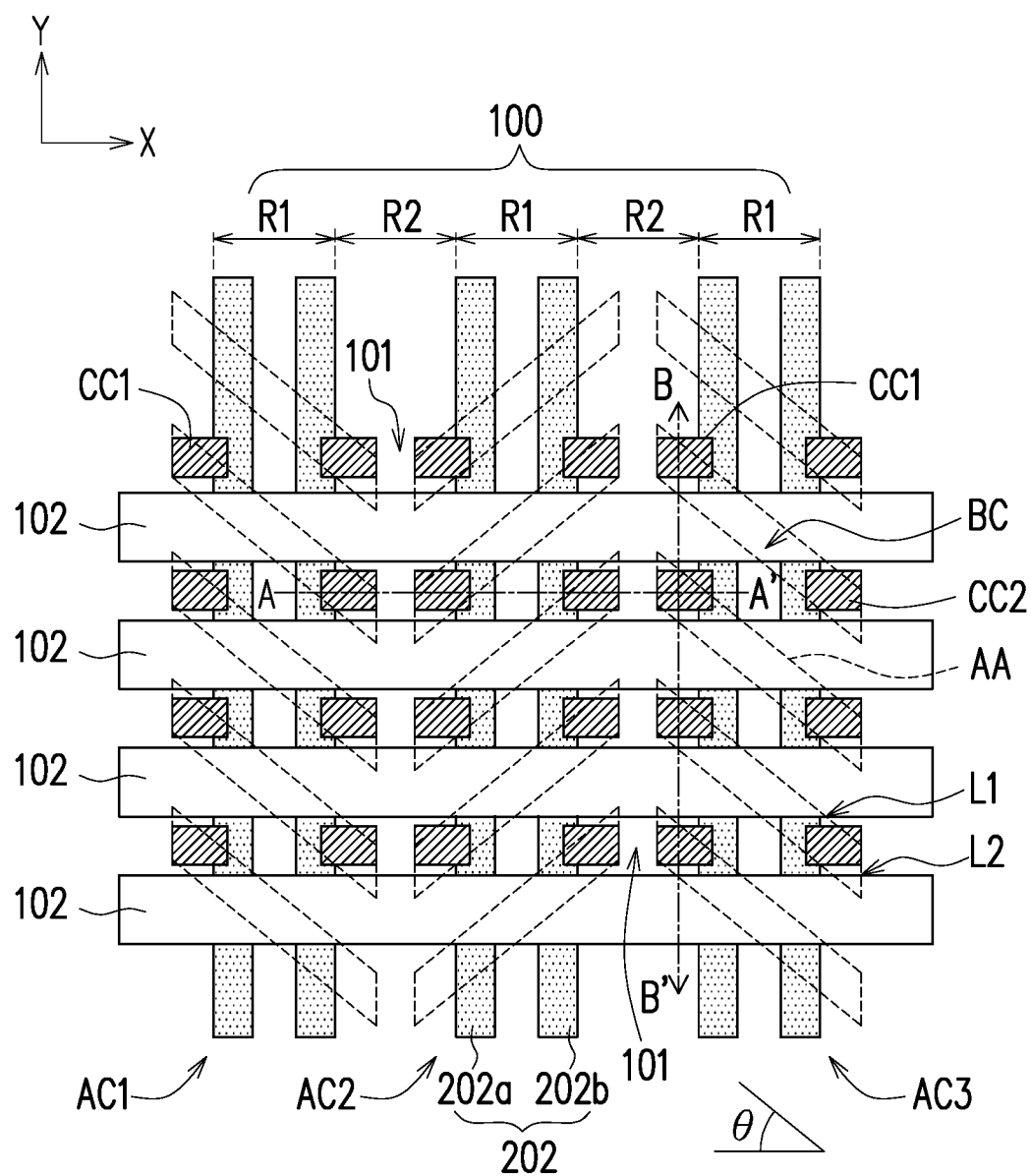
FIG. 1 is a schematic top view of a memory device according to an embodiment of the invention.

The invention will be described more comprehensively with reference to the figures of the present embodiments. However, the invention may also be implemented in various forms, and is not limited to the embodiments in the present specification. The thicknesses of the layers and regions in the figures are enlarged for clarity. The same or similar reference numerals represent the same or similar devices and will not be repeated in the following paragraphs.

FIG. 1 is a schematic top view of a memory device according to an embodiment of the invention. The memory device described in the following embodiment is taken a dynamic random access memory (DRAM) as an example, but the invention is not limited thereto.

Referring to FIG. 1, the present embodiment provides a memory device including a substrate 100, a plurality of isolation structures 101, a plurality of active areas AA, a plurality of bit-line structures 102, a plurality of word line sets 202 and a plurality of capacitor contacts CC1 and CC2. For clearness of the figure, FIG. 1 only illustrates the aforementioned elements, and other elements may refer to the cross-sectional views illustrated in subsequent FIGS. 2A to 2L and FIGS. 3A to 3L.

As illustrated in FIG. 1, the substrate 100 includes a plurality of first regions R1 and a plurality of second regions R2. The first regions R1 and the second regions R2 are alternately arranged in an X direction. The isolation structures 101 are disposed in the substrate 100 to define the active areas AA in the substrate 100. In other words, one isolation structures 101 is provided between adjacent two active areas AA. In an embodiment, only one memory cell is formed on one active area AA, and each of the memory cells is separated by the isolation structures 101, so as to effectively reduce an interference issue among the memory cells. Specifically, the active areas AA are configured in a shape of band and arranged in an array. In the present embodiment, the active areas AA are arranged in three active area columns AC1 to AC3, and adjacent two active area columns are disposed in a mirror manner. For instance, a long-side direction of the active area column AC3 and the X direction are not orthogonal to each other and have an included angle θ, and a long-side direction of the active area column AC2 and the X direction are not orthogonal to each other and have an included angle (180°−θ). In an embodiment, the included angle θ may range between 20 degrees and 22 degrees. However, the invention is not limited thereto, in other embodiments, adjacent two active area columns may also be disposed in the same manner.

The bit-line structures 102 are located on the substrate 100 and cross the first regions R1 and the second regions R2. The bit-line structures 102 extend in the X direction and are arranged with each other along a Y direction. The word line sets 202 are located in the first regions R1 of the substrate 100. The word line sets 202 are disposed along the Y direction and arranged with each other in the X direction. Each word line set 202 has two buried word lines 202a and 202b. In an embodiment, the X direction and the Y direction are substantially perpendicular to each other.

In the present embodiment, each active area AA has a long side L1 and a short side L2, and the long side L1 crosses the corresponding word line set 202 (i.e., including two buried word lines 202a and 202b), and an overlapping area of each active area AA and its corresponding bit-line structure 102 has a bit line contact BC. Thus, each bit-line structure 102 crossing its corresponding word line set 202, may be electrically connected with a corresponding doped area (not shown) through the bit line contact BC. The doped area is located between the two buried word lines 202a and 202b.

The capacitor contacts CC1 and CC2 are located between the bit-line structures 102 on the substrate 100. Specifically, the capacitor contacts CC1 and CC2 are respectively disposed at two terminals of the long side L1 of each active area AA and may electrically connect the active areas AA with subsequently formed capacitors (not shown). In addition, even though the capacitor contacts CC1 and CC2 are presented in a rectangular shape in FIG. 1, the actually formed contacts is slightly represented in a circular shape and sizes thereof may be designed based on process requirements.

FIG. 2A to FIG. 2L are schematic cross-sectional views of a manufacturing process of the memory device along line A-A' depicted in FIG. 1. FIG. 3A to FIG. 3L are schematic cross-sectional views of a manufacturing process of the memory device along line B-B' depicted in FIG. 1.

Figure 3A:
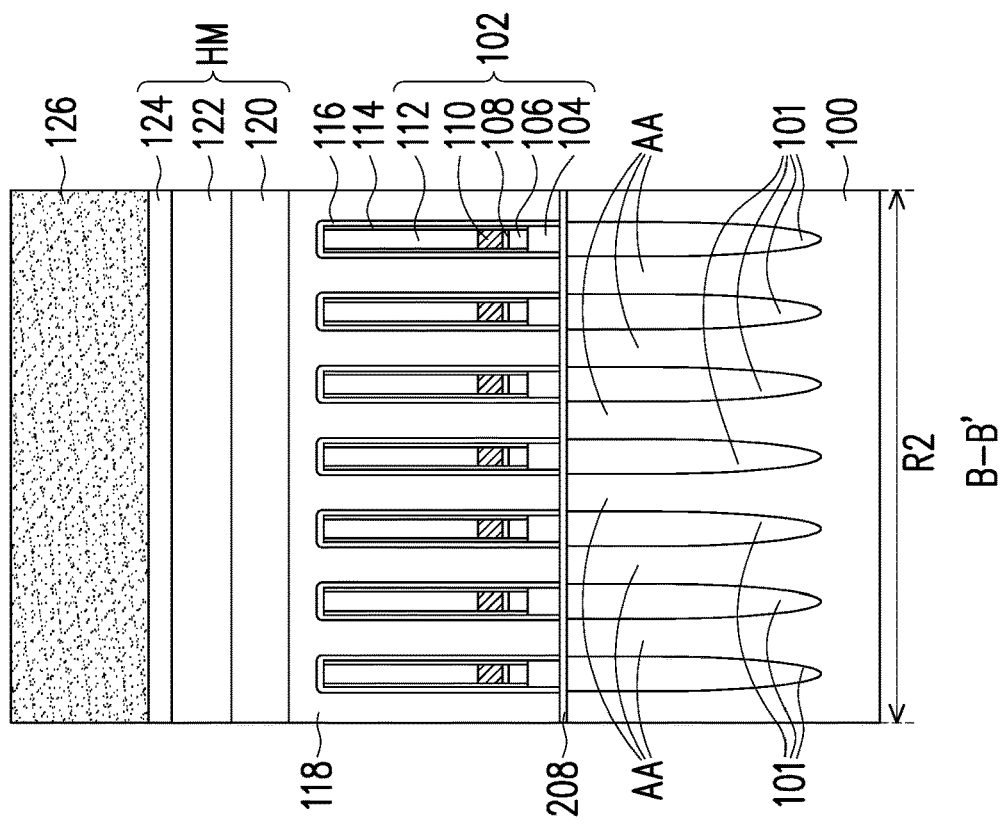
Figure 2A:
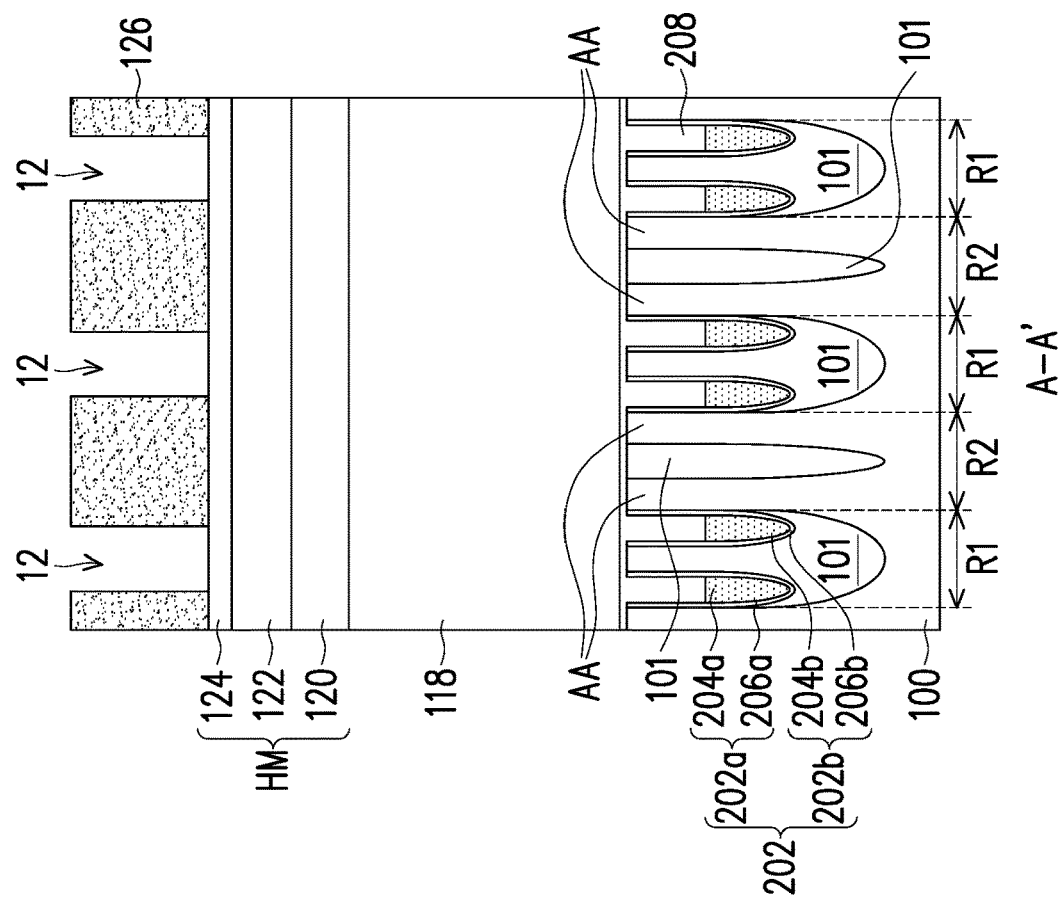

Referring to FIG. 1, FIG. 2A, and FIG. 3A simultaneously, the present embodiment provides a method of manufacturing the memory device, which includes the following steps. First, an initial structure including a substrate 100, a plurality of isolation structures 101, a plurality of bit-line structures 102 and a plurality of word line sets 202 is provided. In an embodiment, the substrate 100 may be, for example, a semiconductor substrate, a semiconductor compound substrate or a semiconductor over insulator (SOI). In the embodiment, the substrate 100 is a silicon substrate.

As illustrated in FIG. 1 and FIG. 3A, the isolation structures 101 are disposed in the substrate 100 to divide the substrate 100 into a plurality of active areas AA. In an embodiment, the isolation structures 101 include a dielectric material, and the dielectric material may be silicon oxide. In another embodiment, the isolation structures 101 may be shallow trench isolation (STI) structures, for example.

As illustrated in FIG. 1 and FIG. 2A, the word line sets 202 are disposed in the substrate 100 in the first regions R1. Specifically, each word line set 202 includes two buried word lines 202a and 202b. Each buried word line 202a includes a gate 204a and a gate dielectric layer 206a. The gate dielectric layer 206a surrounds the gate 204a to electrically isolate the gate 204a from the substrate 100. In an embodiment, a material of the gate 204a includes, for example, a conductive material, which may be, for example, a metal material, a barrier metal material or a combination thereof, and a method of forming the gate 204a may be a chemical vapor deposition (CVD) method or a physical vapor deposition (PVD) method. A material of the gate dielectric layer 206a may be, for example, silicon oxide, and a method of forming the gate dielectric layer 206a may be a CVD method, a thermal oxidation method, an in situ steam generation (ISSG) method or the like. Similarly, another buried word line 202b also includes a gate 204b and a gate dielectric layer 206b. The gate dielectric layer 206b surrounds the gate 204b to electrically isolate the gate 204b from the substrate 100. Additionally, the initial structure further includes a silicon nitride layer 208. Specifically, the silicon nitride layer 208 is disposed on the buried word lines 202a and 202b and extending to cover top surfaces of the substrate 100 and the isolation structures 101. In an embodiment, a method of forming the silicon nitride layer 208 may be a CVD method.

Referring back to FIG. 1 and FIG. 3A, the bit-line structures 102 are formed on the substrate 100. Referring to the cross-section of FIG. 3A, each bit-line structure 102, from bottom to top, includes a silicon oxide layer 104, a silicon nitride layer 106, a barrier layer 108, a bit line 110 and a cap layer 112. The first spacer 114 covers a sidewall of the silicon nitride layer 106, a sidewall of the barrier layer 108, a sidewall of the bit line 110 and a sidewall of the cap layer 112. The second spacer 116 covers a sidewall of the first spacer 114, a sidewall of the silicon oxide layer 104, and a top surface of the cap layer 112. On the other hand, along the cross-section of the active areas AA, each bit-line structure 102, for bottom to top, includes a bit line contact (not shown), the barrier layer 108, the bit line 110 and the cap layer 112. The bit-line structures 102 may be electrically connected to the active areas AA (which are source/drain doped areas) through the bit line contacts (not shown).

In an embodiment, a material of the bit line contact (not shown) may be polysilicon or silicon germanium. A material of the barrier layer 108 includes a barrier metal material which may be TiN, for example. A material of the bit line 110 may be a metal material which may be W, for example. A material of the cap layer 112 may be silicon nitride. In addition, a metal silicide layer (not shown) may be provided between the bit line contact (not shown) and the bit line 110, which may be TiSi, CoSi, NiSi or a combination thereof, for example.

Figures 2D, 3D:
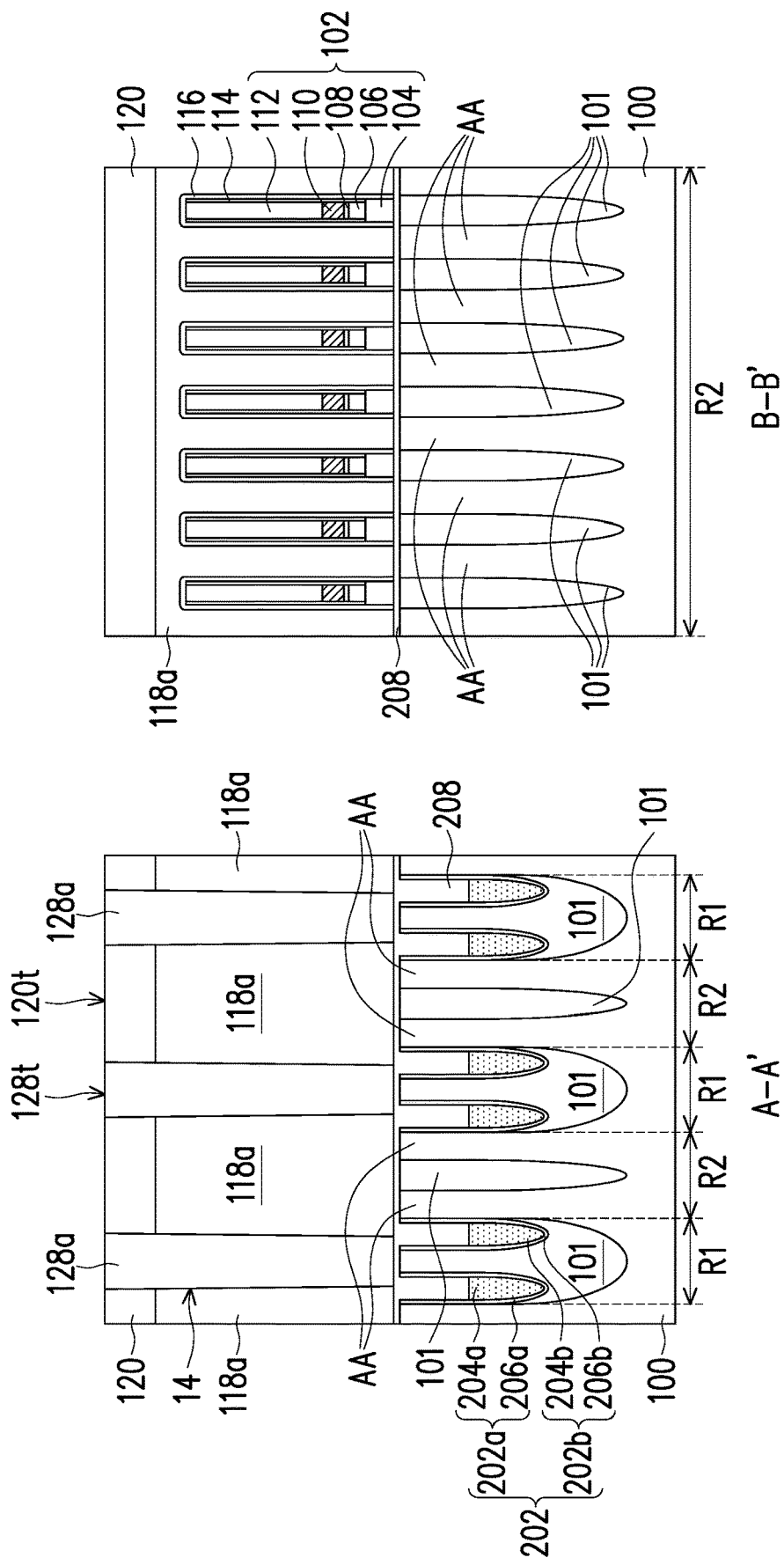
Figure 3F:
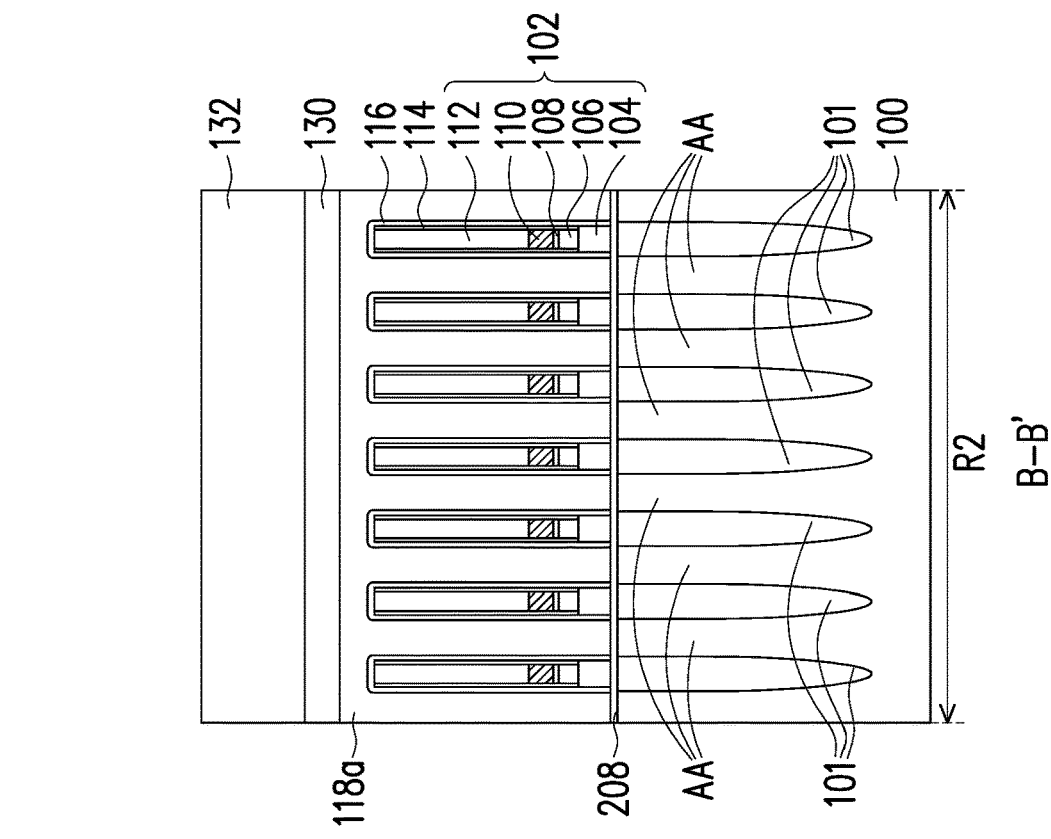
Figures 2G, 3G:
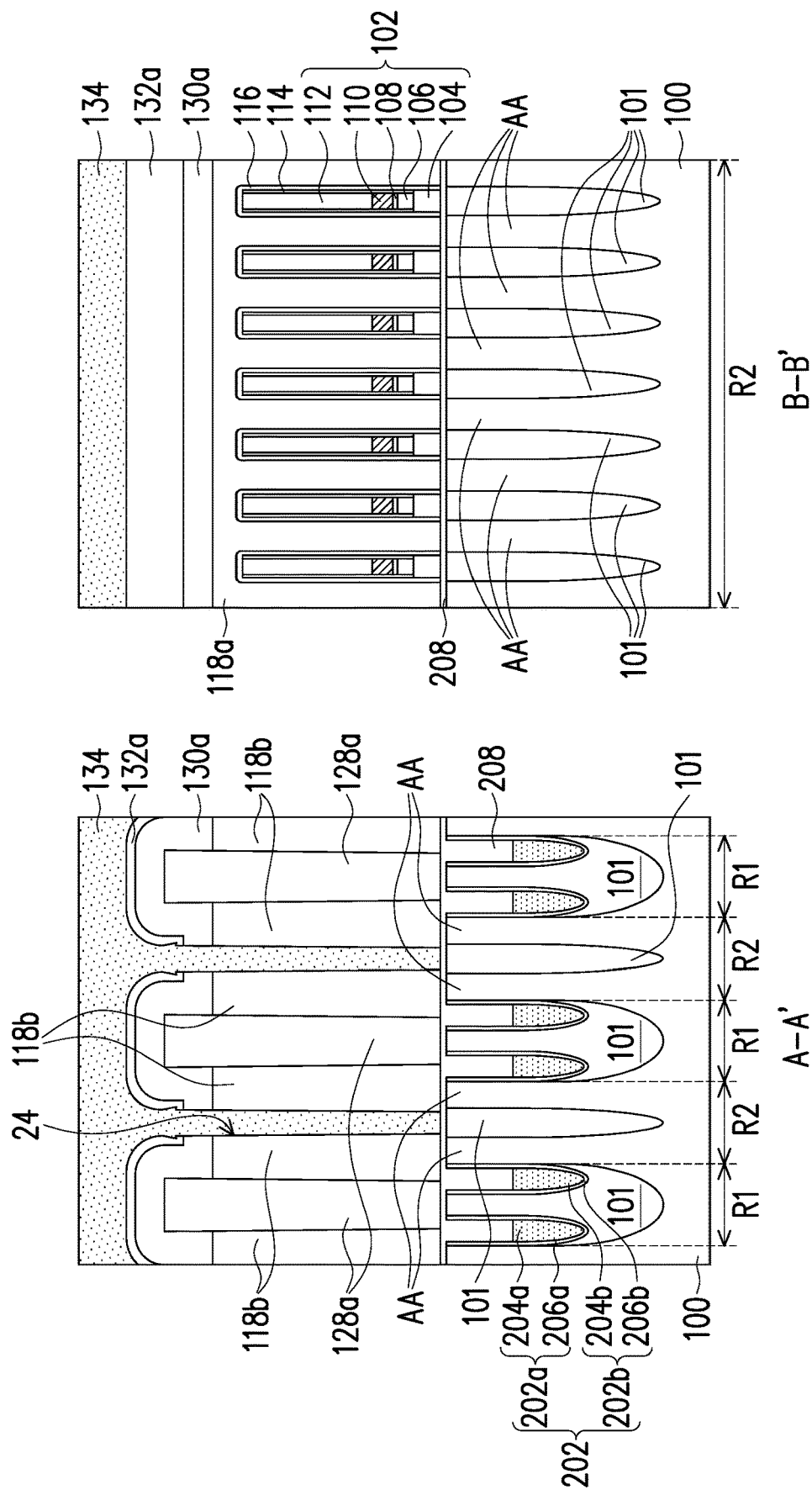
Figure 3H:
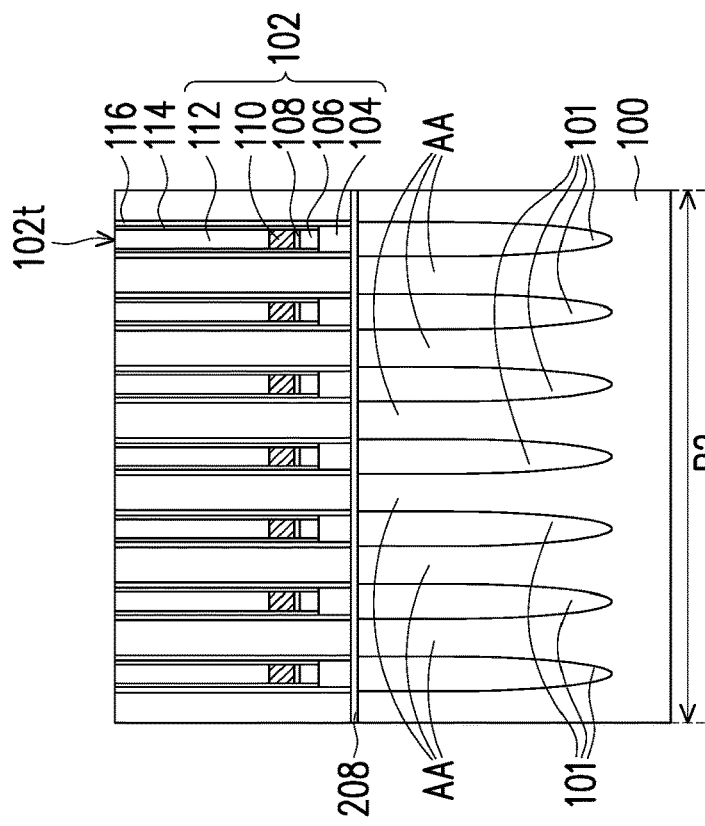
Figure 3I:
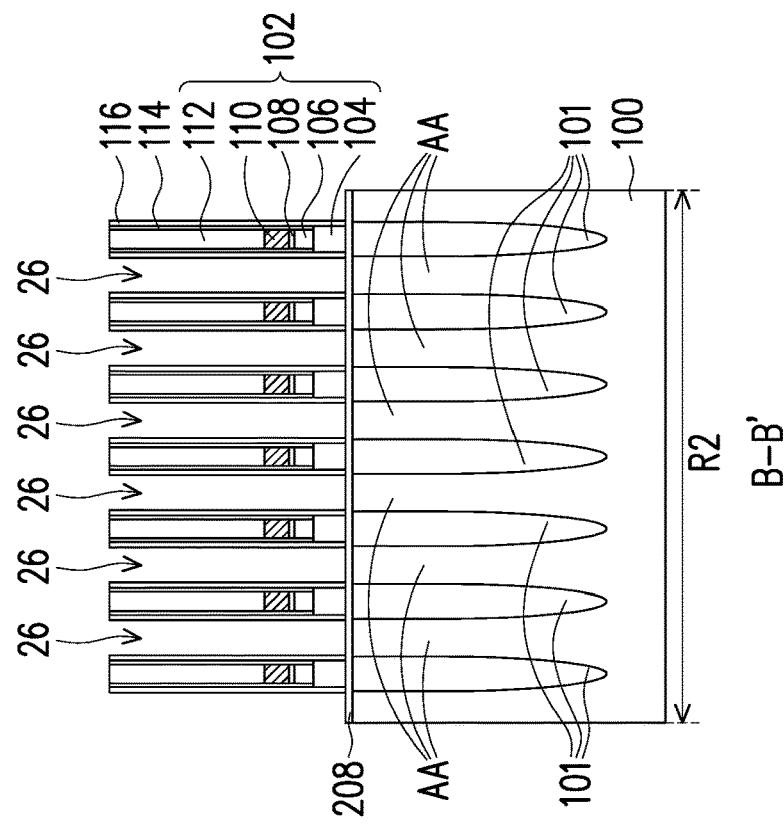
Figures 2J, 3J:
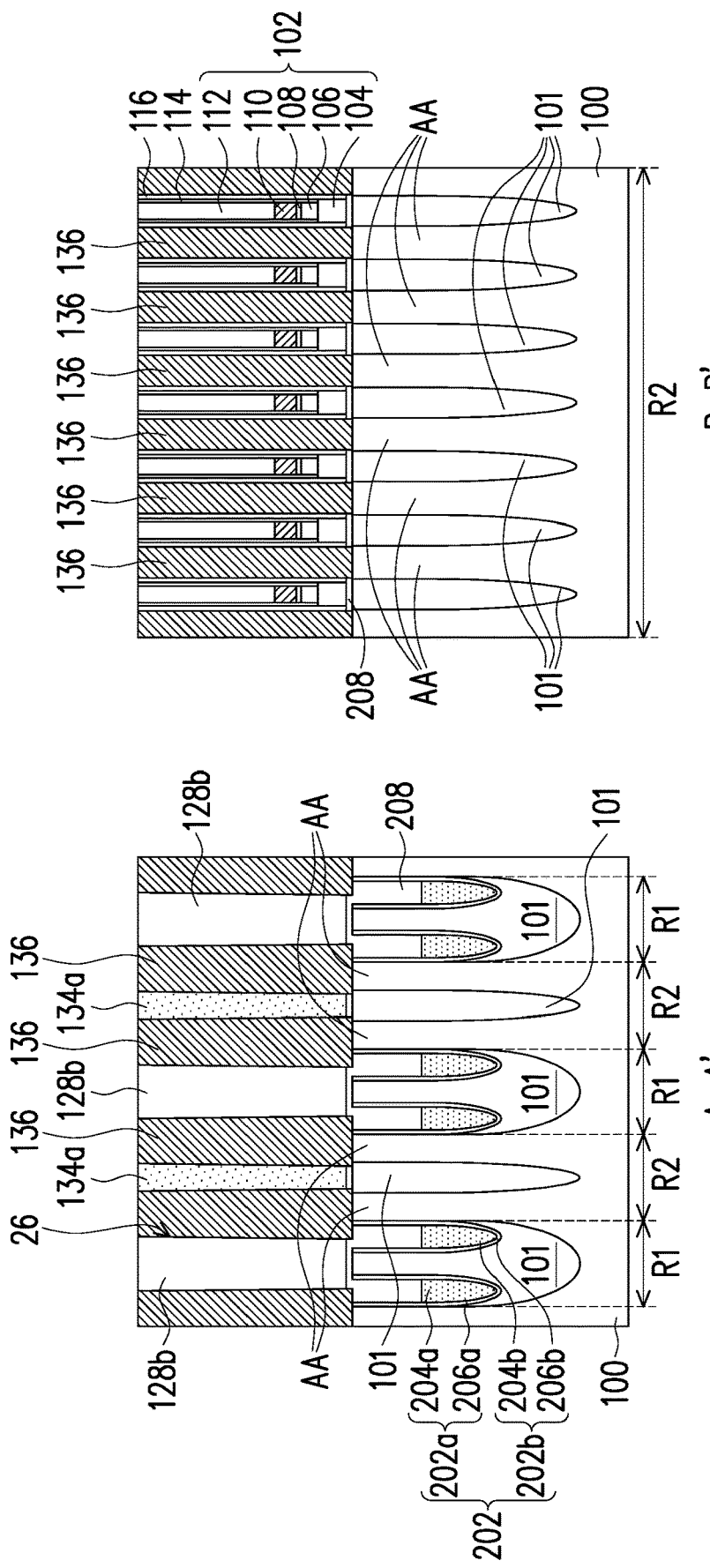

It should be noted that the first spacers 114 and the second spacers 116 may be strip-shaped, extend in the X direction and protect sidewalls of the bit-line structures 102 to electrically isolate the bit-line structures 102 from a subsequently formed conductive material 136 (as illustrated in FIG. 3J). Additionally, a material of the first spacers 114 may be silicon nitride, and a material of the second spacers 116 may be silicon oxide. A method of forming the first spacers 114 and the second spacers 116 is similar to a method of forming conventional spacers and will not be described in detail. In an embodiment, as the second spacers 116 are made of silicon oxide, in comparison with the conventional silicon nitride, the second spacers 116 of the present embodiment may effectively reduce parasitic capacitance between each adjacent bit-line structures 102, so as to enhance memory performance. However, the invention is not limited thereto, the material of the second spacers 116 may be any other low dielectric constant material (i.e., a dielectric material with a dielectric constant lower than 4).

Referring to FIG. 2A and FIG. 3A simultaneously, a first dielectric layer 118 is formed over the initial structure (or the substrate 100). The first dielectric layer 118 is filled in the spaces between the bit-line structures 102 and extends to cover top surfaces of the bit-line structures 102. In an embodiment, the first dielectric layer 118 may include spin-on dielectric (SOD).

As shown in FIG. 2A and FIG. 3A, a silicon oxide layer 120, a carbon layer 122 and a silicon oxynitride layer 124 are sequentially formed over the first dielectric layer 118. In an embodiment, a composite layer including the silicon oxide layer 120, the carbon layer 122 and the silicon oxynitride layer 124 may be considered as a hard mask layer HM. In another embodiment, the silicon oxide layer 120 may be, for example, tetraethyl orthosilicate (TEOS).

As shown in FIG. 2A and FIG. 3A, a photoresist pattern 126 is formed on the silicon oxynitride layer 124 (or the hard mask layer HM). The photoresist pattern 126 has a plurality of openings 12. The openings 12 may be strip-shaped openings which extend in the Y direction and expose a part of a surface of the silicon oxynitride layer 124. On the other hand, the openings 12 are only disposed on the substrate 100 in the first region R1 and correspond the word line sets 202.

Referring to FIG. 2B and FIG. 3B simultaneously, with the photoresist pattern 126 employed as a mask, a part of the hard mask layer HM and a part of the first dielectric layer 118 are removed to form a plurality of first trenches 14 in remaining silicon oxide layer 120 and first dielectric layer 118a. The first trenches 14 extend in the Y direction and expose the top surface of the silicon nitride layer 208 in the first regions R1. In other words, the first trenches 14 separate each adjacent two first dielectric layers 118a, such that the first dielectric layers 118a are located on the substrate 100 in the second regions R2.

Referring to FIGS. 2B to 2C and FIGS. 3B to 3C simultaneously, after removing the photoresist pattern 126, the silicon oxynitride layer 124, and the carbon layer 122, a dielectric material 128 is formed on the silicon oxide layer 120. The dielectric material 128 is filled in the first trenches 14 and covers a top surface 120t of the silicon oxide layer 120. In an embodiment, the dielectric material 128 may be nitride, such as silicon nitride, for example.

Referring to FIGS. 2C to 2D and FIGS. 3C to 3D simultaneously, a first etching back process is performed on the dielectric material 128 to remove a portion of the dielectric material 128, so as to expose top surface 120t of the silicon oxide layer 120. In the case, top surfaces 128t of second dielectric layers 128a filling in the first trenches 14 are substantially coplanar with the top surface 120t of the silicon oxide layer 120. In alternative embodiments, the first dielectric layer 118a and the silicon oxide layer 120 thereon may be considered as a whole of first dielectric layer.

Referring to FIGS. 2D to 2E and FIGS. 3D to 3E simultaneously, the silicon oxide layer 120 is removed. As illustrated in FIG. 2E, a top surface 118t of the first dielectric layer 118a is lower than the top surface 128t of the second dielectric layer 128a. In an embodiment, there is a height difference H between the top surface 118t of the first dielectric layer 118a and the top surface 128t of the second dielectric layer 128a, where the height difference H may range between 55 nm and 65 nm. In alternative embodiments, a portion of the first dielectric layer 118a is also removed.

Figure 2F:
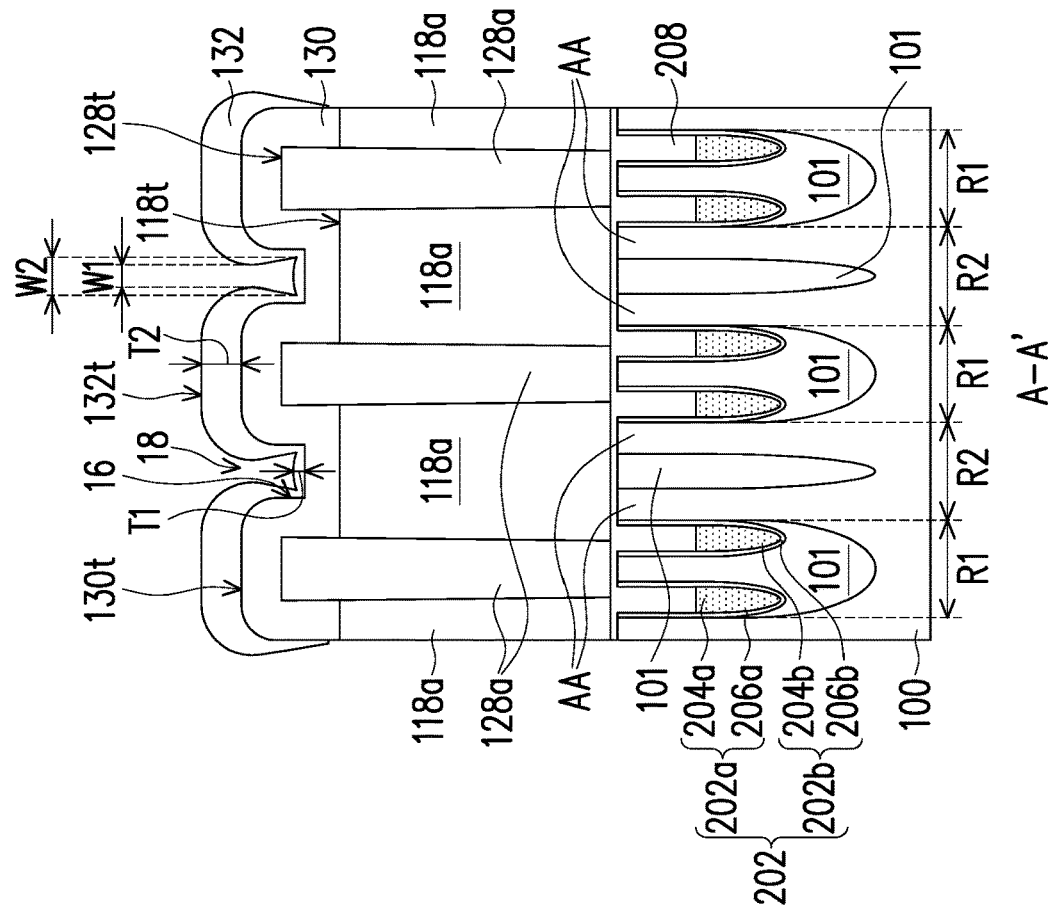

Referring to FIG. 2F and FIG. 3F simultaneously, a first mask layer 130 is formed over the substrate 100. In an embodiment, the first mask layer 130 includes dielectric material, such as oxide, nitride, oxynitride, or a combination thereof for example, and is formed by an atomic layer deposition (ALD) method or the like. In the embodiment, the first mask layer 130 may be ultra-low temperature oxide (ULTO). As shown in FIG. 2F, the first mask layer 130 conformally covers a morphology of the top surface 118t of the first dielectric layer 118a and the top surfaces 128t of the second dielectric layers 128a, so as to form an uneven surface 130t. In some embodiments, the first mask layer 130 may be, for example, a continuous concave-convex structure with an uniform thickness. The first mask layer 130 located on the first dielectric layer 118a is a concave part, and the first mask layer 130 located on the second dielectric layer 128a is a convex part. In alternative embodiments, the top surface 130t of the first mask layer 130 has a plurality of first recesses 16 respectively corresponding to the isolation structures 101 in the second areas R2 (or the top surface 118t of the first dielectric layer 118a).

Figure 2H:
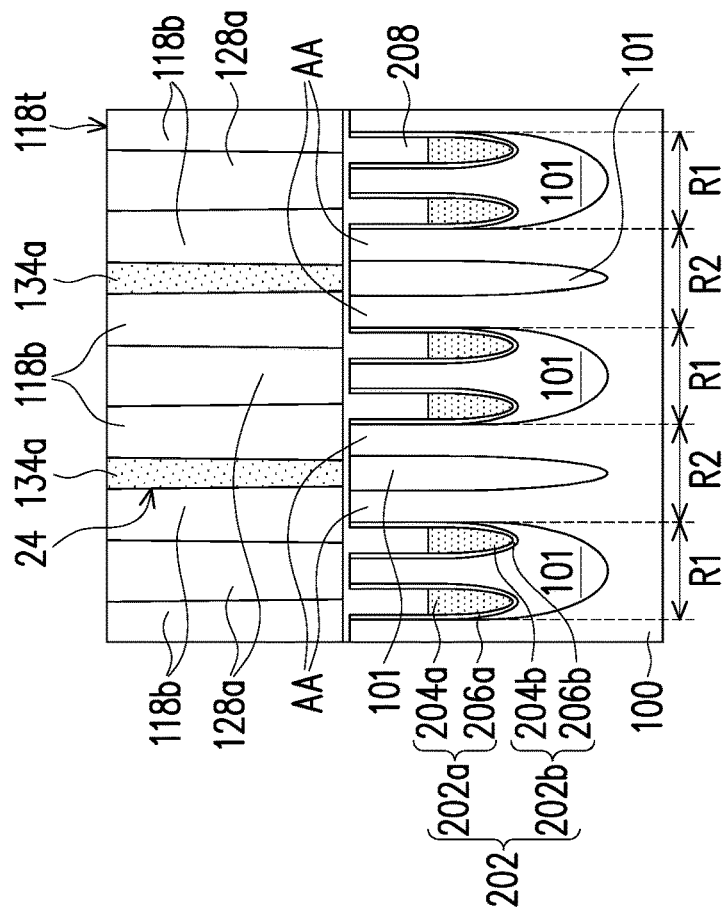
Figure 2I:
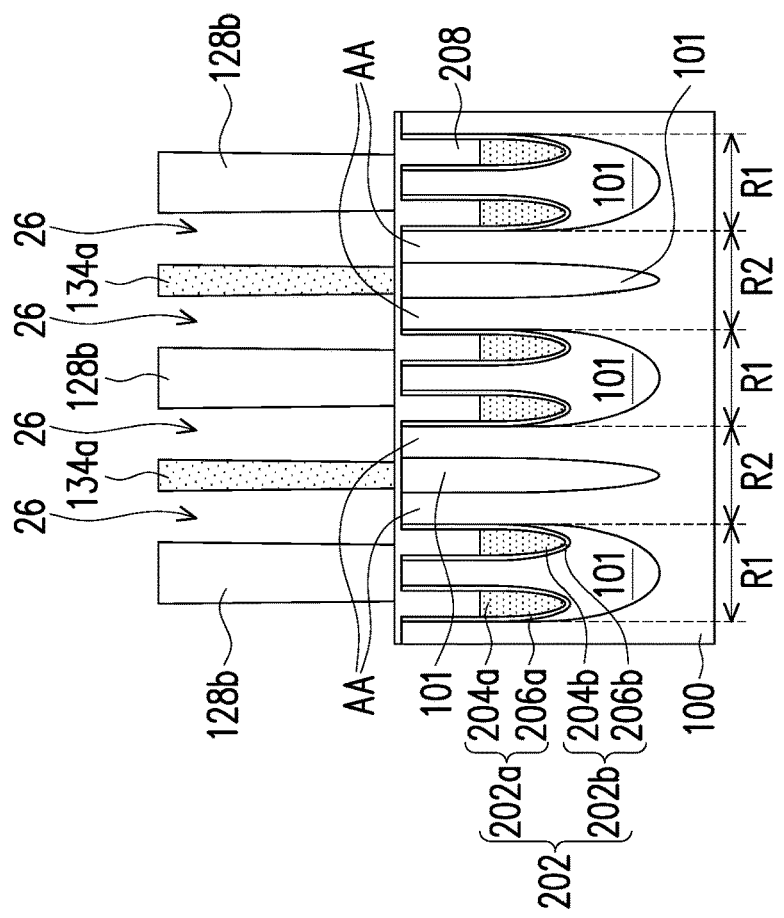

As shown in FIG. 2F and FIG. 3F, a second mask layer 132 is formed on the first mask layer 130. In an embodiment, the second mask layer 132 includes dielectric material, such as oxide, nitride, oxynitride, or a combination thereof for example, is formed by a CVD method or the like. In the embodiment, the second mask layer 132 may be plasma-enhanced silicon nitride (PESIN). Specifically, as shown in FIG. 2F, the second mask layer 132 fills in the first recesses 16, so that a plurality of second recesses 18 are formed on a top surface 132t of the second mask layer 132. The second mask layer 132 disposed on the first dielectric layer 118a (or the second mask layer 132 disposed in the first recesses 16) has a first thickness T1, and the second mask layer 132 disposed on the second dielectric layer 128a has a second thickness T2. In an embodiment, the second thickness T2 is greater than the first thickness T1. In alternative embodiments, the second mask layer 132 is a non-first mask layer, thus, an overhang would be formed at a top of the second recess 18. In the case, as shown in FIG. 2F, a cross-sectional profile of the second recess 18 has a shape with a narrower upper portion and a wider lower portion. That is, a bottom width W2 of the second recess 18 is greater than a top width W1 of the second recess 18. In the embodiment, the second mask layer 132 is benefit for controlling a width of a third dielectric layer 134a (as shown in FIG. 2H). It will be explained in detail in the subsequent paragraphs and will not be described here.

Referring to FIGS. 2F to 2G and FIGS. 3F to 3G simultaneously, a blanketly etching process (which is referred to as a first etching process) is performed by using the second mask layer 132 and the first mask layer 130 as a mask, so as to form a plurality of second trenches 24 in the first dielectric layer 118a. Specifically, the second trenches 24 extend along the second recesses down through the second mask layer 132a, the first mask layer 130a, and the first dielectric layer 118b, to expose the silicon nitride layer 208 in the second regions R2. During the formation of the second trenches 24, a portion of the second mask layer 132 is removed, so that a thickness of the second mask layer 132a is less than a thickness of the second mask layer 132. In the embodiment, the second trenches 24 are formed by using the second mask layer 132 and the first mask layer 130 as an etching mask, and the second trenches 24 are aligned with the isolation structures 101 in the second regions R2 without additional mask. Therefore, the second trenches 24 are referred to as self-align trenches. In the case, the process steps and photomasks may be reduced, thereby decreasing the manufacturing cost, in the embodiment.

In one embodiment, the foregoing blanketly etching process has high etch selectivity with respect to the second mask layer 132 and the first mask layer 130. That is, an etch rate of the first mask layer 130 is greater than an etch rate of the second mask layer 132 in the blankety etching process. In addition, since the first thickness T1 of the first second mask layer 132 is less than the second thickness T2 thereof, thus, the thinner second mask layer 132 disposed in the first recesses 16 is removed faster, thereby exposing the underlying first mask layer 130, during the blankety etching process. On the other hand, the thicker mask layer 132 on the dielectric material 128a may be used as an etching mask to prevent the first mask layer 130 from undergoing over etching.

Further, in an embodiment, the foregoing blankety etching process has high etch selectivity with respect to the second mask layer 132 and the first dielectric layer 118a. That is, an etch rate of the first dielectric layer 118a is greater than the etch rate of the second mask layer 132 in the blankety etching process. In this case, the second mask layer 132 may be used as an etching mask to form the second trenches 24 in the first dielectric layer 118a.

It should be noted that, if the blankety etching process is directly performed without forming the second mask layer 132, the first mask layer 130 would be over-etched and then the second trenches 24 would be widened that greater than the width of the first recesses 16 in the blankety etching process. In the case, a width of the third dielectric layer 134a (as shown in FIG. 2H) that is subsequently formed by filling in the second trenches 24 would increase, thereby reducing a width of the subsequently formed capacitor contacts CC1 and CC2 (as shown in FIG. 2L). That is, a contact area between the active area AA and the capacitor contacts CC1 and CC2 is reduced. It results in the resistance between the active area AA and the capacitor contacts CC1 and CC2 increasing, thereby decreasing the operating speed and performance of the memory device. On the other hand, if the width of the second trenches 24 is too large, it is not conductive to reducing the critical dimension (CD) of the memory device.

As shown in FIG. 2G, a dielectric material 134 is formed on the substrate 100 after the second trenches 24 are formed. The dielectric material 134 is filled in second trenches 24 and extends to cover the top surface of the second mask layer 132a. In an embodiment, the dielectric material 134 may be, for example, oxide, nitride, oxynitride, or a combination thereof, which may be formed by an ALD method, a CVD method, or the like. In the present embodiment, the dielectric material 134 may be nitride, such as silicon nitride, for example.

Referring to FIGS. 2G to 2H and FIGS. 3G to 3H simultaneously, a second etching back process is performed to remove a portion of the dielectric material 134, the second mask layer 132a, the first mask layer 130a, and a portion of the first dielectric layers 128a, so as to expose the top surface 118t of the first dielectric layer 118b. In the case, the dielectric material 134 in the second trenches 24 may be referred to as third dielectric layers 134a which separated from adjacent two first dielectric layers 118b. In another embodiment, as shown in FIG. 3H, a portion of the second spacers 116 is removed to expose a top surface 102t of the bit-line structures 102.

Referring to FIGS. 2H to 2I and FIGS. 3H to 3I simultaneously, an etching process (which is referred to as a second etching process) is performed to remove the first dielectric layer 118b, so as to form a plurality of contact openings 26 between the second dielectric layers 128b and the third dielectric layers 134a. In an embodiment, the etching process includes a dry etching process, a wet etching process, or a combination thereof. For example, the dry etching process is only performed. On the other hand, the dry etching process is performed prior to the wet etching process, so as to avoid damaging the top surface of the substrate 100. In the embodiment, an etching rate of the first dielectric layer 118b is greater than an etching rate of the second dielectric layer 128b and the third dielectric layer 134b in the etching process. That is, the first dielectric layer 118b is completely removed, while no or only few the second dielectric layer 128b and the third dielectric layer 134b are removed. Further, although the contact openings 26 illustrated in FIGS. 2I and 3I expose the top surface of the silicon nitride layer 208, the invention is not limited thereto. In other embodiments, the foregoing etching process also removes a portion of the silicon nitride layer 208, so as to expose the substrate 100 in the second regions R2. In alternative embodiments, after the etching process is performed, additional etching process is performed to remove a portion of the silicon nitride layer 208, so as to expose the substrate 100 in the second regions R2.

Referring to FIGS. 2J and FIGS. 3J simultaneously, a conductive material 136 is formed to fill in the contact openings 26. In an embodiment, the conductive material 136 is polysilicon for example, is formed by performing a CVD method and then performing a chemical mechanical polishing (CMP) process.

Figures 2K, 3K:
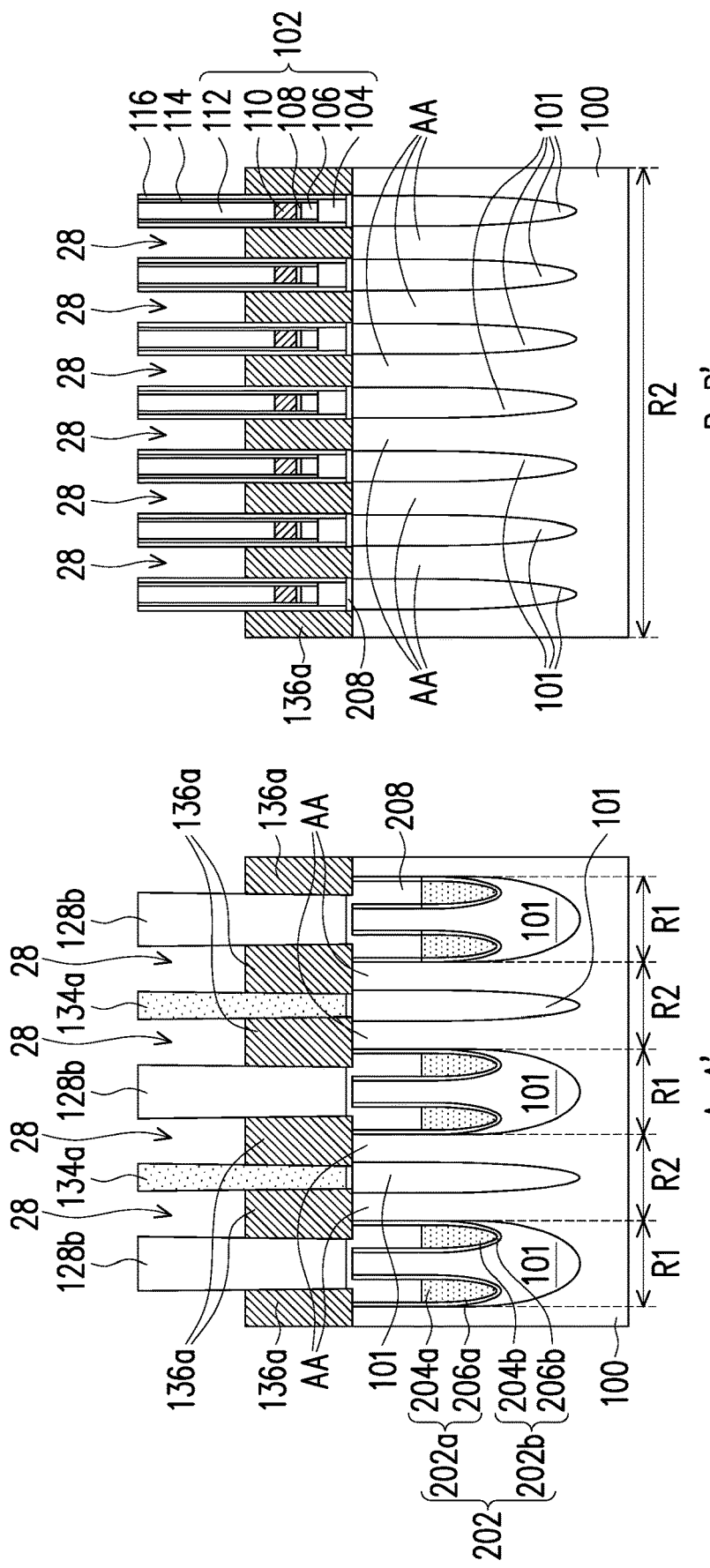
Figures 2L, 3L:
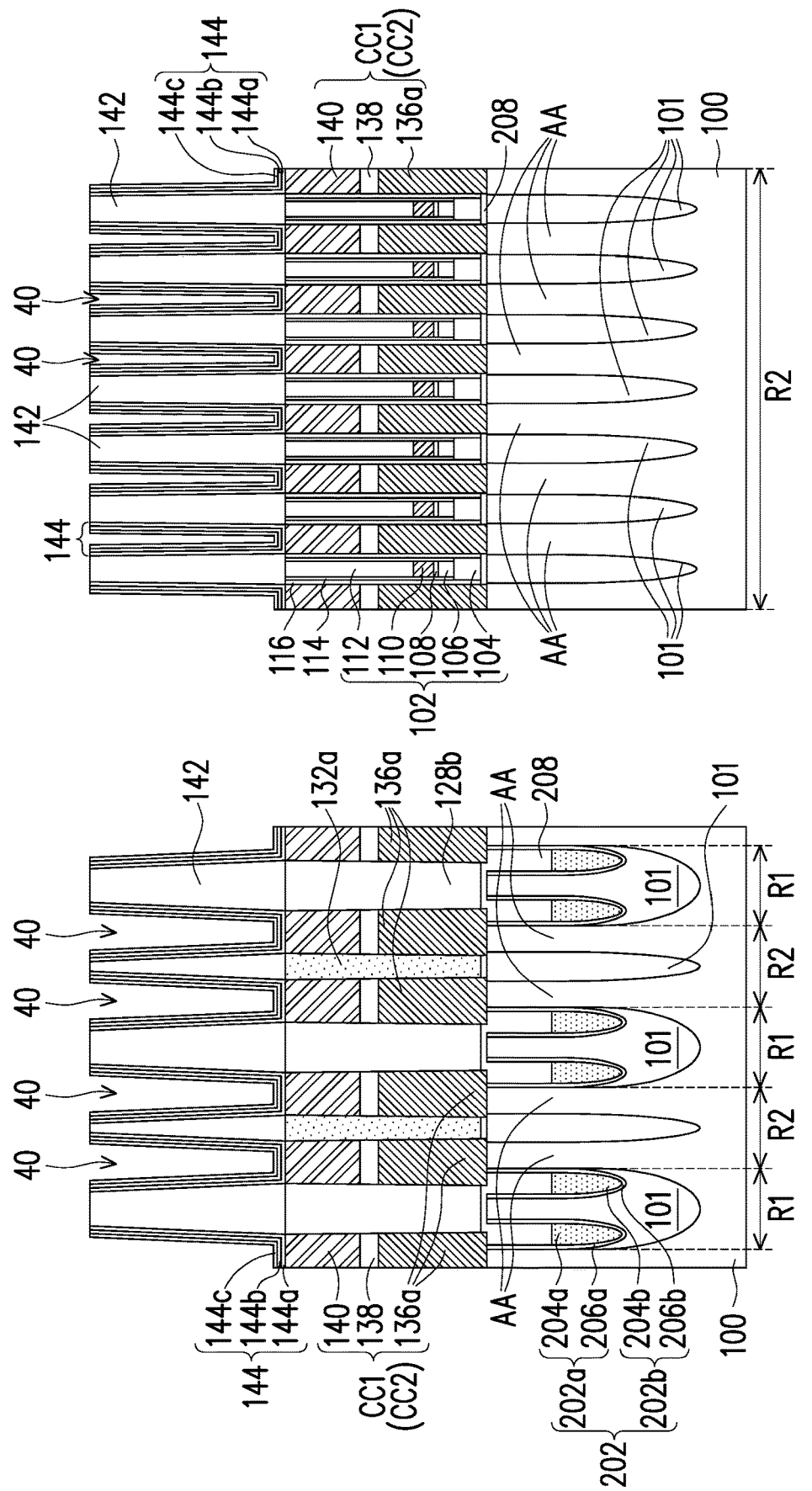

Referring to FIGS. 2J to 2L and FIGS. 3J to 3L simultaneously, a portion of the conductive material 136 is removed to form a plurality of openings 28 on the conductive materials 136a. A shown in FIG. 2K, the openings 28 are disposed between the second dielectric layers 128b and the third dielectric layers 134a. As shown in FIG. 3K, the openings 28 are disposed between the bit-line structures 102.

As shown in FIG. 2L and FIG. 3L, a metal silicide layer 138 and a metal layer 140 are formed on the conductive material 136a. In an embodiment, the metal silicide layer 138 may be, for example, TiSi, CoSi, NiSi or a combination thereof. In an embodiment, the metal layer 140 may be, for example, W. As illustrated in FIG. 2L, a composite structure including the conductive material 136a, the metal silicide layer 138 and the metal layer 140 may be considered as a capacitor contact CC1 or CC2. The capacitor contacts CC1 and CC2 are disposed at both terminals of each active area AA to electrically connect the active area AA with a subsequently formed capacitor 144.

In an embodiment, as illustrated in FIG. 2L, the capacitor contacts CC1 and CC2 cover not only surfaces of the active areas AA, but also a part of top surfaces of the buried word lines 202a. Specifically, in the embodiment, the capacitor contacts CC1 and CC2 are formed by a damascene method. Therefore, each of the capacitor contacts CC1 and CC2 may be a rectangular structure. That is, the capacitor contacts CC1 and CC2 have sidewalls substantially perpendicular to the top surface of the substrate 100. In addition, the capacitor contacts CC1 and CC2 are formed by filling the conductive material 136 in the second trenches 24. In the case, compared with steps of patterning the conductive material, the manufacturing method of the embodiment is able to control the width or critical dimension of the capacitor contacts CC1 and CC2 accurately, thereby enhancing a reliability of the memory device.

Additionally, in the case, the third dielectric layers 134a respectively correspond to the isolation structures 101 in the substrate 100 in the second regions R2 to electrically isolate adjacent two capacitor contacts CC1 and CC2 from each other.

Referring to FIG. 2L and FIG. 3L simultaneously, a dielectric layer 142 is first formed over the substrate 100.

Thereafter, a plurality of capacitor openings 40 are formed in the dielectric layer 142, and a plurality of capacitors 144 are respectively formed in the capacitor openings 40. The capacitors 144 are electrically connected to the active areas AA respectively through the capacitor contacts CC1 and CC2. Specifically, the capacitor 144 includes a lower electrode 144a, an upper electrode 144c and a dielectric layer 144b. The dielectric layer 144b is located between the lower electrode 144a and the upper electrode 144c. The lower electrodes 144a are electrically connected respectively with the capacitor contacts CC1 and CC2. In an embodiment, a material of the dielectric layers 142 may be, for example, silicon oxide. A material of the lower electrodes 144a and the upper electrodes 144c is, for example, titanium nitride, tantalum nitride, tungsten, titanium tungsten, aluminum, copper or metal silicide. The dielectric layer 144b may include a high dielectric constant material layer (i.e., a dielectric material with a dielectric constant higher than 4), and a material thereof includes, for example, oxides of the following elements, such as hafnium, zirconium, aluminum, titanium, lanthanum, yttrium, gadolinium, tantalum or aluminum nitride or any combination of the elements.

It should be noted that as both the second dielectric layers 128b and the third dielectric layers 134a are made of silicon nitride, the second dielectric layers 128b and the third dielectric layers 134a may be employed as etching stop layers when the capacitor openings 40 are formed. The etching stop layers may prevent a short-circuit issue resulted from the electrical connected between the adjacent two capacitor contacts CC1 and CC2 due to over etching when the capacitor openings 40 are formed. On the other hand, even though an issue, e.g., overlay shift or misalignment, occurs during the process of forming the capacitor openings 40, the second dielectric layers 128b and the third dielectric layers 134a made of silicon nitride may also prevent the over etching issue when the capacitor openings 40 are formed, thereby preventing the short-circuit issue from occurring to the adjacent two capacitor contacts CC1 and CC2. Thus, the capacitor contacts CC1 and CC2 of the present embodiment may be capable of maintaining the post structures without sharp corners generated at bottoms of the capacitor contacts CC1 and CC2.

In view of the foregoing, in the invention, the first dielectric layer is first formed, the second and third dielectric layers are then formed in the first dielectric layer. Thereafter, the first dielectric layer is removed to form a plurality of contact openings. The conductive material is then formed to fill in the contact openings, so as to form a plurality of capacitor contacts. That is, in the invention, the capacitor contacts are formed by the damascene method, which is able to simplify the method of manufacturing the capacitor contacts and control the critical dimension of the capacitor contacts accurately, thereby enhancing the reliability of the memory device. Moreover, the material of the dielectric layers beside the capacitor contacts is substituted by silicon nitride in the invention, and thereby, a short-circuit issue occurring to the adjacent two capacitor contacts due to over etching can be prevented.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of manufacturing a memory device, comprising:
   forming a plurality of isolation structures in a substrate to divide the substrate into a plurality of active areas;
   forming a plurality of word line sets in the substrate, wherein the word line sets extend in a Y direction and pass through the isolation structures and the active areas;
   forming a plurality of bit-line structures on the substrate, wherein the bit-line structures extend in the X direction and cross the word line sets;
   forming a first dielectric layer on the substrate between the bit-line structures;
   forming a plurality of first trenches in the first dielectric layer, wherein the first trenches respectively correspond the word line sets;
   filling in the first trenches with a second dielectric layer;
   removing a portion of the first dielectric layer, so that a top surface of the first dielectric layer is lower than a top surface of the second dielectric layer;
   forming a first mask layer to cover the top surface of the first dielectric layer and the top surface of the second dielectric layer;
   performing a first etching process by using the first mask layer as a mask to form a plurality of second trenches in the first dielectric layer;
   filling the second trenches with a third dielectric layer;
   removing the first dielectric layer to form a plurality of contact openings between the second and third dielectric layers; and
   filling in the contact openings with a conductive material.

2. The method according to claim 1, wherein a top surface of the first mask layer has a plurality of first recesses corresponding to the isolation structures.

3. The method according to claim 2, further comprising forming a second mask layer on the first mask layer, wherein the second mask layer fills in the first recesses, so that a plurality of second recesses are formed on a top surface of the second mask layer.

4. The method according to claim 3, wherein a bottom width of the second recess is greater than a top width thereof.

5. The method according to claim 3, wherein the second mask layer on the first dielectric layer has a first thickness, the second mask layer on the second dielectric layer has a second thickness, and the second thickness is greater than the first thickness.

6. The method according to claim 3, wherein the first mask layer comprises ultra-low temperature oxide (ULTO), atomic layer deposition (ALD) oxide, or a combination thereof.

7. The method according to claim 3, wherein the second mask layer comprises nitride.

8. The method according to claim 3, wherein an etching rate of the first mask layer is greater than an etching rate of the second mask layer in the first etching process.

9. The method according to claim 3, wherein an etching rate of the first dielectric layer is greater than an etching rate of the second mask layer in the first etching process.

10. The method according to claim 3, wherein the removing the first dielectric layer to form the contact openings comprises performing a second etching process which comprises a dry etching process, a wet etching process, or a combination thereof.

11. The method according to claim 10, wherein an etching rate of the first dielectric layer is greater than an etching rate of the second and third dielectric layers in the second etching process.

12. The method according to claim 1, wherein the first dielectric layer comprises spin-on dielectric (SOD).

13. The method according to claim 1, wherein the second dielectric comprises nitride.

14. The method according to claim 1, wherein the third dielectric layer comprises nitride.

15. The method according to claim 1, wherein after the filling in the contact openings with the conductive material, the method further comprises:

recessing the conductive material;
 forming a metal silicide layer on the conductive material; and
 forming a metal layer on the metal silicide layer.

16. The method according to claim 1, further comprising forming a plurality of capacitors on the conductive material, wherein one of the capacitors comprises a lower electrode, an upper electrode, and a dielectric layer between the lower electrode and the upper electrode.

* * * * *